United States Patent
Mueller

(10) Patent No.: US 7,705,608 B2
(45) Date of Patent: Apr. 27, 2010

(54) CALIBRATING A LIGHT-SENSITIVE CHIP

(75) Inventor: Thomas Mueller, Graz (AT)

(73) Assignee: Austriamicrosystems AG, Unterpremstatten (AT)

(*) Notice: Subject to any disclaimer, the term of this patent is extended or adjusted under 35 U.S.C. 154(b) by 614 days.

(21) Appl. No.: 10/526,097

(22) PCT Filed: Aug. 5, 2003

(86) PCT No.: PCT/EP03/08665

§ 371 (c)(1),
(2), (4) Date: Sep. 7, 2005

(87) PCT Pub. No.: WO2004/021454

PCT Pub. Date: Mar. 11, 2004

(65) Prior Publication Data

US 2006/0154387 A1 Jul. 13, 2006

(30) Foreign Application Priority Data

Aug. 30, 2002 (DE) ............... 102 40 083

(51) Int. Cl.
G01R 35/00 (2006.01)
G01R 31/00 (2006.01)
G01R 31/02 (2006.01)

(52) U.S. Cl. ............ 324/601; 324/96; 324/754

(58) Field of Classification Search .......... 324/601, 324/96, 501, 767
See application file for complete search history.

(56) References Cited

U.S. PATENT DOCUMENTS

| 4,131,488 A | | 12/1978 | Lesk et al. | |
|---|---|---|---|---|
| 5,047,711 A | * | 9/1991 | Smith et al. | 324/760 |
| 5,072,112 A | * | 12/1991 | Ohno | 250/226 |
| 5,572,472 A | * | 11/1996 | Kearney et al. | 365/201 |
| 5,844,928 A | | 12/1998 | Shastri et al. | |
| 6,621,284 B2 | * | 9/2003 | D'Angelo | 324/763 |
| 6,700,661 B1 | * | 3/2004 | Cadell et al. | 356/326 |
| 6,876,187 B2 | * | 4/2005 | Matsuyama | 324/96 |
| 7,043,109 B2 | * | 5/2006 | Kish et al. | 385/14 |
| 7,339,245 B2 | | 3/2008 | Mueller | |
| 2001/0020123 A1 | * | 9/2001 | Diab et al. | 600/323 |
| 2002/0048022 A1 | * | 4/2002 | Schmelzer | 356/425 |

(Continued)

FOREIGN PATENT DOCUMENTS

DE 29 04 984 5/1982

(Continued)

OTHER PUBLICATIONS

German Examination Report from corresponding application dated Nov. 17, 2004.

(Continued)

Primary Examiner—Jeff Natalini
(74) Attorney, Agent, or Firm—Fish & Richardson P.C.

(57) ABSTRACT

A method for use with a light-sensitive integrated circuit includes applying different wavelengths of light to the integrated circuit to produce output signals in response to the different wavelengths of light, measuring the output signals to obtain measured values, comparing the measured values to setpoint values that correspond to the different wavelengths of light, obtaining correction values for the different wavelengths of light that are based on the comparison, and storing the correction values on the integrated circuit.

16 Claims, 2 Drawing Sheets

U.S. PATENT DOCUMENTS

2002/0070359 A1* 6/2002 Kai et al. ............... 250/504 R
2006/0108654 A1   5/2006 Mueller
2006/0244965 A1* 11/2006 Ichijo ..................... 356/338

FOREIGN PATENT DOCUMENTS

| DE | 199 62 938 | 7/2001 |
|----|------------|--------|
| JP | 62017621   | 1/1987 |
| JP | 62274234   | 11/1987 |
| JP | 02105078   | 4/1990 |
| JP | 05218327   | 8/1993 |
| JP | 07-022477  | 1/1995 |
| JP | 09045744   | 2/1997 |
| WO | WO97/24728 | 7/1997 |
| WO | WO01/86723 | 11/2001 |

OTHER PUBLICATIONS

IEEE Internet page showing the publication date of 1999 for the Perry reference.

Perry R. J. "Analysis and Characterization of the Spectral Response of CMOS based Integrated Circuit (IC) Photodetectors" Proceedings of the Thirteenth Biennial University/Government/Industry Microelectronics Symposium; pp. 170-175 (1999).

English Translation of International Preliminary Examination Report for application PCT/EP2003/008665.

* cited by examiner

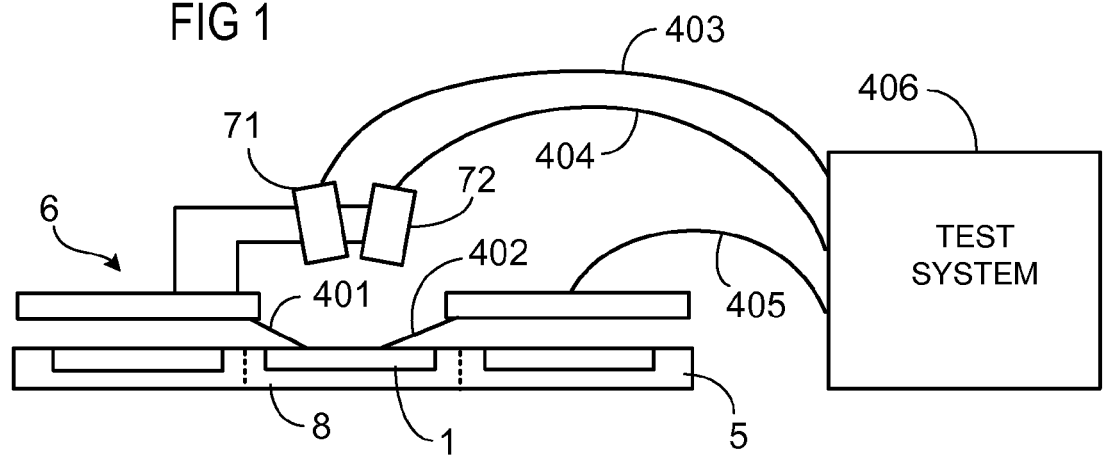
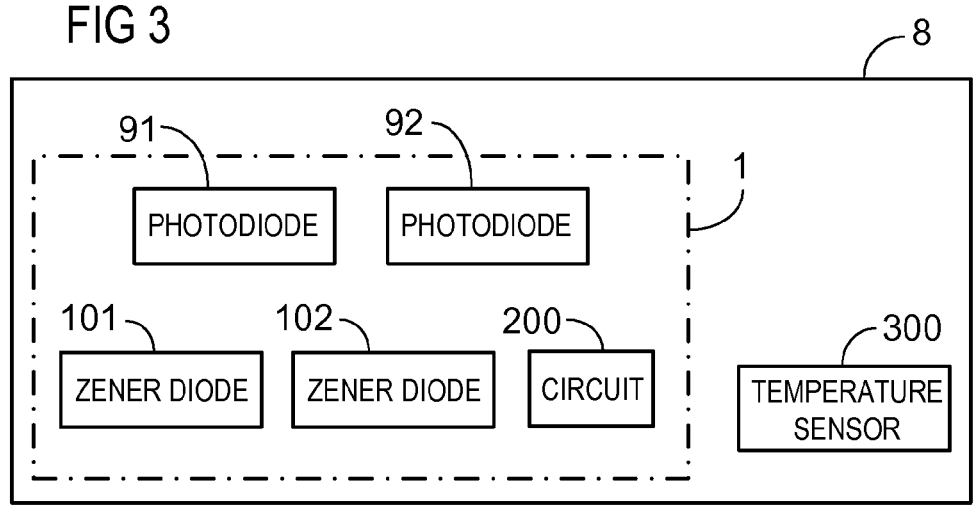

CALIBRATING A LIGHT-SENSITIVE CHIP

TECHNICAL FIELD

This patent application relates to a method for calibrating a photodiode, the output signals of the photodiode being measured at different measured wavelengths. This patent application also relates to a semiconductor chip having a photodiode. Furthermore, this patent application relates to a method for operating the semiconductor chip.

BACKGROUND

Light-sensitive integrated circuits, which provide an electric output signal, such as an electric current, when irradiated with light of a specific wavelength, are known. Interference at the surfaces of the light-sensitive integrated circuit facing toward the light source and further effects cause the electrical signal generated by the integrated circuit to be strongly dependent on the incident light wavelength. This effect is undesirable in the precise measurement of light using integrated circuits.

In order to reduce the wavelength dependence of the output signal, applying an antireflective coating to the surface of the light-sensitive integrated circuit facing toward the light source is known from the publication U.S. Pat. No. 4,131,488. Such a coating has the disadvantage that it requires an additional process step when manufacturing the light sensor.

SUMMARY

Described herein is a method for setting the wavelength-dependent output signal of a light-sensitive integrated circuit which reduces the necessity for antireflective coatings and has a high flexibility in regard to the wavelength dependence of the output signal to be set.

A method for setting the wavelength-dependent output signal of a light-sensitive integrated circuit is specified, the output signals of the integrated circuit being measured at different wavelengths. The measured values measured at each wavelength are compared to predefined setpoint values. There is a setpoint value for every measured wavelength in this case. Correction values are calculated by comparison between the measured values and a setpoint value. Information about these correction values is stored permanently in the integrated circuit.

Because, according to the method, correction values and/or information about correction values is stored directly on the integrated circuit and may subsequently be used to adapt the output signals, technological measures on the surface of the integrated circuit for eliminating undesired wavelength dependencies of the output signal may be dispensed with.

The method for setting the wavelength-dependent output signal has the advantage that it is not restricted to the elimination of undesired signal oscillations at different wavelengths. Rather, any arbitrary wavelength characteristic may be set for the light-sensitive integrated circuit.

In one embodiment of the method, an integrated circuit is used which is a component of a semiconductor substrate. The setting is performed using a testing card for integrated circuits.

Methods for testing semiconductor chips and/or methods for testing semiconductor substrates, in the form of wafers, for example, are known, for example, from the publication JP 090 45 744 A, the content of whose disclosure is expressly referred to here. Testing devices of this type for photodetectors may advantageously be used to execute the method specified here. The construction necessary must only be altered slightly, which is advantageous.

In one embodiment of the method, one or more light-emitting diodes are used as the light source for measuring the output signals. Such LEDs have the advantage that they emit light at a fixed frequency and, in addition, they have a very well-known behavior of their optical power density as a function of the current applied to the LEDs. LEDs also have the advantage that they are easy and inexpensive to manufacture and are thus advantageously usable for the method specified here.

Furthermore, LEDs have the advantage that they are available in very many different wavelengths.

In one embodiment of the method, an integrated circuit is used whose wavelength-dependent sensitivity runs in a wave. The smallest interval between two measured wavelengths is selected so that it is less than each interval between a relative sensitivity maximum and a relative sensitivity minimum. It is therefore ensured that the determination of the actual characteristic of the photosensitive component is performed sufficiently precisely, and that the linear interpolation between the measured points does not lead to significant measurement errors because of the presence of relative maxima or minima between two measured points, for example.

In another embodiment of the method, a sensitivity curve, which is compared to a setpoint curve, is determined for the measured values using interpolation. A correction curve is calculated from this comparison, information about this correction curve being stored permanently in the integrated circuit.

In one embodiment of the method, an integrated circuit is used which comprises one or more photodiodes. Photodiodes may be applied well for the purpose pursued here because of their well-known properties, particularly the well-known dependence of the output signal on the optical power density which is irradiated onto the component.

Specifically, such photodiodes allow the calibration, i.e., the setting of the wavelength-dependent output signals to be performed using light-emitting diodes which do not all provide identical optical power densities on the light-sensitive integrated circuit. Rather, it is sufficient if the optical power density on the surface of the light-sensitive integrated circuit is known for each measured frequency, i.e., for each light-emitting diode. Standardization of the measured signals to a uniform optical power density may be performed using simple means without anything further.

In one embodiment of the method, Zener diodes are used to store the information on the integrated circuit. However, other storage media which allow permanent storage of information may also be used. For example, fuses containing polycrystalline silicon, or even "laser trimming", in which resistance values are permanently changed using a laser by melting away resistor material, come into consideration. Another possibility for storing information on the integrated circuit is the use of EEPROM="electrically erasable programmable read only memory".

Furthermore, a semiconductor chip is described, which contains a light-sensitive integrated circuit. Information is stored on the light-sensitive integrated circuit for correcting the wavelength-dependent output signal of the integrated circuit. Such a semiconductor chip has the advantage that wavelength-dependent optical measurements may be performed, the data stored on the chip allowing the wavelength dependence to be eliminated or to be changed into a predefined wavelength dependence.

In one embodiment of the semiconductor chip, a temperature sensor for measuring the temperature of an external light source is additionally provided, and correction data are also stored on the chip which are used to correct the temperature-dependent wavelength of the external light source.

Such a semiconductor chip has the advantage that the very precise measurement of light sources whose optical power density is a function of the temperature is made possible.

Furthermore, a method for operating a semiconductor chip is specified, an external light source illuminating the integrated circuit and an output signal thus being generated. The information about the wavelength of the light source is transmitted to the integrated circuit during the measurement. On the basis of the transmitted wavelength and with the aid of the information stored on the integrated circuit for correcting the wavelength-dependent output signal of the integrated circuit, the wavelength-dependent output signal of the integrated circuit may be corrected and/or changed.

In one embodiment of the method, the temperature of the external light source is measured by using a suitable semiconductor chip. The information about the wavelength of the external light source transmitted to the chip is corrected using the measured temperature and the corresponding correction data, which is also stored on the chip, and is then used for the correction of the wavelength dependence of the output signal.

In the following, embodiments are described with reference to associated figures.

DESCRIPTION OF THE DRAWINGS

FIG. 1 shows a measurement arrangement for performing the method specified.

FIG. 3 shows an example of a specified semiconductor chip in a top view.

DETAILED DESCRIPTION

Figure 2:
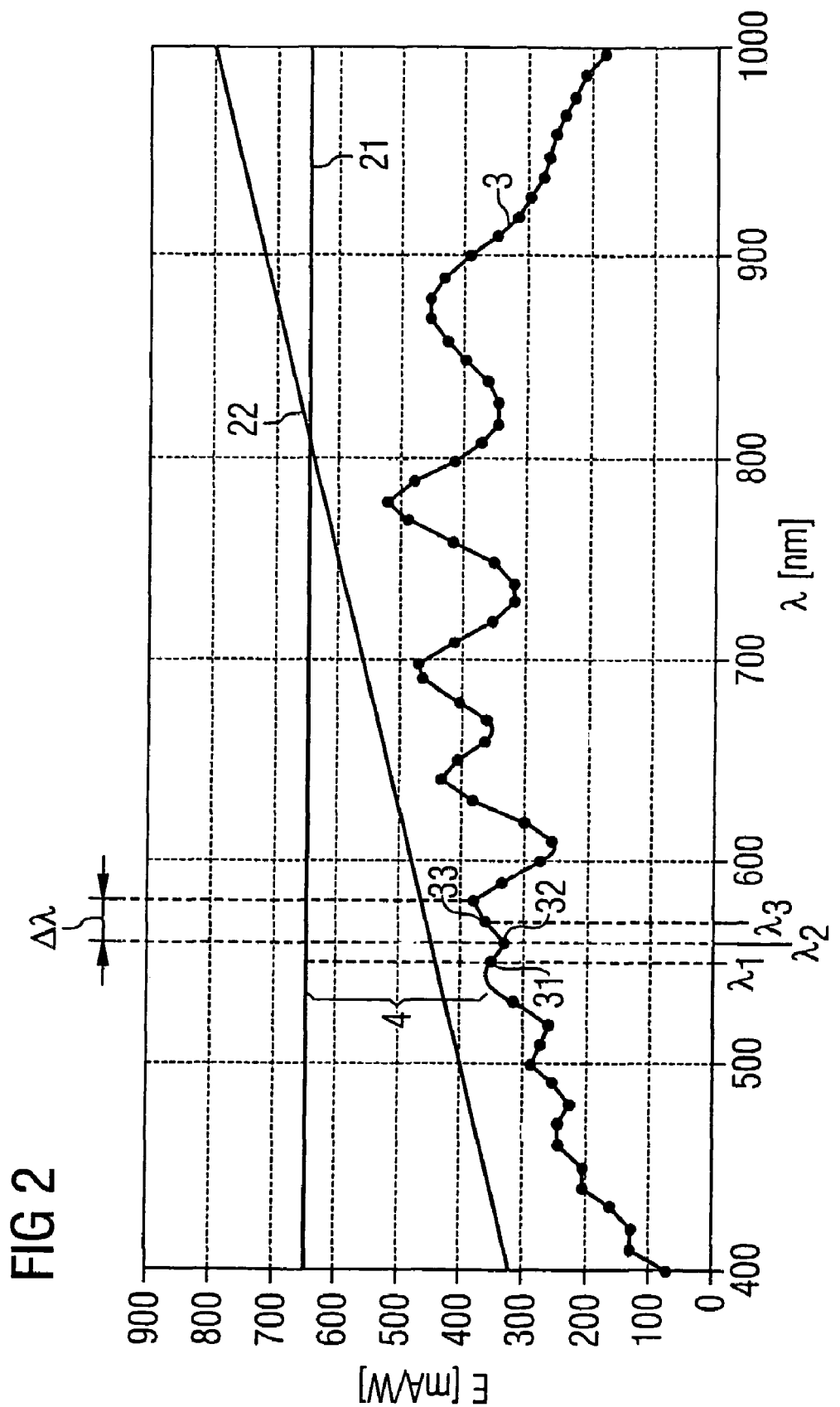
FIG. 2 shows the wavelength-dependent sensitivity of a light-sensitive integrated circuit as an example in a schematic illustration.

FIG. 1 shows an arrangement for performing the method. A semiconductor substrate 5 is provided, which contains a light-sensitive integrated circuit 1. The semiconductor substrate 5 may be a silicon wafer, for example. The light-sensitive integrated circuit 1 may be isolated to form a semiconductor chip 8 in a later manufacturing step. A testing card 6 for integrated circuits is positioned over the semiconductor substrate 5. Light-emitting diodes 71, 72 are mounted on the top of the testing card 6. These light-emitting diodes 71, 72 irradiate the light-sensitive integrated circuit 1 with light of different wavelengths. In this case, the wavelength of the light with which the light-emitting diode 71 illuminates the light-sensitive integrated circuit 1 is different from the wavelength of the light with which the light-emitting diode 72 illuminates the light-sensitive integrated circuit 1. The light-emitting diodes 71, 72 are connected using connection lines 403, 404 to a test system 406, which supplies the light-emitting diodes 71, 72 with current. The testing card 6 is in turn independently connected to the test system 406 using one or more connection lines 405. Testing needles 401, 402 are provided for contacting the testing card 6 with the semiconductor substrate 5. These testing needles 401, 402 are used for the purpose of being placed on provided contact areas of the sensitive integrated circuit 1 and either absorbing current generated in the light-sensitive integrated circuit 1 or storing data on the light-sensitive integrated circuit 1.

It is also to be noted that the testing card 6 is designed so that the light-emitting diodes 71, 72 positioned on the top of the testing card 6 may illuminate the light-sensitive integrated circuit 1 positioned below the testing card 6. Such a suitable design of the testing card 6 may, for example, comprise the testing card 6 having an opening at the illumination point of the light-sensitive integrated circuit 1.

FIG. 2 shows the output signals, measured using the arrangement from FIG. 1, of a photodiode located on the light-sensitive integrated circuit. In this case, the sensitivity E of the photodiode, measured in mA per watt of irradiated optical power, is plotted over the irradiated wavelength λ, plotted in the unit nm. FIG. 2 shows a sensitivity curve 3, which may be determined through interpolation from the wavelength-dependent sensitivities of the photodiode measured using the arrangement of FIG. 1. It is to be noted that the curve 3 may have a somewhat different shape for each chip, as a function of the manufacturing tolerances, which may shift the interference pattern by up to 20 μm.

The intervals of the measured wavelengths λ1, λ2, λ3 are to be selected in this case so that the intervals, represented by differences between two wavelengths, e.g., λ2−λ1, are smaller than the intervals Δλ, between a relative minimum and a relative maximum of the sensitivity curve 3.

However, measured wavelengths whose intervals are greater than Δλ may also be used for interpolation and/or extrapolation, if additional information about the properties of the sensitivity curve is also stored on the chip and only small changes are corrected.

The sensitivities of the photodiode thus measured may be used for the purpose of being compared in the test system 406 with a desired setpoint sensitivity. Different setpoint curves 21, 22 are indicated as examples in FIG. 2. For example, the setpoint curve 21 may be used if one only desires to eliminate the oscillations of the sensitivity curve 3 and generate a wavelength-independent output signal of the photodiode. In this case, a correction value 4 is calculated for each measured value 31, 32, 33 associated with a measured wavelength λ1, λ2, λ3, which represents the difference between the measured value 31 measured at the wavelength λ1 and the value of the setpoint curve 21 specified at the wavelength λ1, for example. It is to be noted in this connection that the correction value 4 does not necessarily represent the simple difference of the value of the setpoint curve 21 at the wavelength λ1 and the measured value 31 at the wavelength λ1. The correction value 4 may also represent a correction factor or a more complicated correction function.

As a further example, the setpoint curve 22 is shown in FIG. 2, which is used if the light sensitivity of the photodiode is to grow linearly with the light wavelength. In this case, the correction may be performed analogously to the way described for the setpoint curve 21.

The correction values 4 are stored on the light-sensitive integrated circuit after performing the measurement and after performing the comparison, in the test system 406, for example. However, only information about the correction values 4, in the form of interpolated curve, for example, may also be stored.

FIG. 3 shows an example of a semiconductor chip 8 which may be used for the method according to FIG. 1 and FIG. 2 and/or which represents a final product of the method. The semiconductor chip 8 comprises a light-sensitive integrated circuit 1, which in turn comprises photodiodes 91, 92 and Zener diodes 101, 102 and further circuits 200. After completion of the measurement, as described in FIG. 2, correction values 4 or an entire correction curve is stored on the semiconductor chip 8. The storage is performed with the aid of the Zener diodes 101, 102, for example, whose electrical properties may be changed permanently by applying a current once.

Furthermore, a temperature sensor 300 may be provided on the semiconductor chip 8, which may be an on-chip temperature sensor, for example, that contains polycrystalline silicon.

If information about an entire correction curve, i.e., for all wavelengths in a specific wavelength range, is stored on the integrated circuit, a correction both in regard to the sensitivity of the photodiode on the chip and in regard to the temperature dependence of the radiation source may be performed at every arbitrary wavelength in the wavelength range, but only in the event of known temperature behavior of the radiation source.

What is claimed is:

1. A method for use with an integrated circuit that is light-sensitive, the method comprising:

applying different wavelengths of light to the integrated circuit, the integrated circuit producing output signals in response to the different wavelengths of light, the integrated circuit comprising a storage medium, the storage medium comprising at least one of a Zener diode, a fuse, or an electrically erasable programmable read-only memory;

measuring the output signals to obtain measured values;

comparing the measured values to setpoint values that correspond to the different wavelengths of light;

obtaining correction values for the different wavelengths of light, the correction values being based on comparison of the measured values to the setpoint values; and storing the correction values on the storage medium of the integrated circuit;

wherein the integrated circuit is on a semiconductor substrate;

wherein the method is performed using a testing card for integrated circuits;

wherein testing needles form contacts between the testing card and the integrated circuit, and wherein the testing needles are for placement on contact areas of the integrated circuit for storing data on the integrated circuit; and wherein the different wavelengths of light are applied via light-emitting diodes that are mounted atop the testing card.

2. The method of claim 1, wherein the integrated circuit comprises one or more photodiodes.

3. The method of claim 1, wherein the correction values are stored using Zener diodes on the integrated circuit.

4. The method of claim 1, wherein the measured values define a sensitivity curve; and wherein a smallest interval between two of the different wavelengths on the sensitivity curve is smaller than an interval between a relative maximum and a relative minimum on the sensitivity curve.

5. The method of claim 4, further comprising:

obtaining the sensitivity curve by interpolating between the measured values; and storing information about the sensitivity curve on the integrated circuit.

6. The method of claim 1, wherein the testing card is configured so that the light-emitting diodes illuminate the integrated circuit that is below the testing card.

7. The method of claim 1, wherein the testing card comprises an opening at an illumination point of the integrated circuit.

8. The method of claim 1, wherein the testing needles are in contact with areas of the integrated circuit to absorb current generated in the integrated circuit.

9. A semiconductor chip comprising:

a semiconductor substrate comprising silicon;

a light-sensitive integrated circuit that stores correction data for use in correcting a wavelength-dependent output signal of the light-sensitive integrated circuit, the wavelength-dependent output signal being an electrical signal; and a temperature sensor for measuring a temperature of an external light source that illuminates the light-sensitive integrated circuit, the light-sensitive integrated circuit for producing the wavelength-dependent output signal in response to light from the external light source;

wherein the correction data is derived using the temperature of the external light source, the light-sensitive integrated circuit comprising a storage medium for storing the correction data, the storage medium comprising at least one of a Zener diode, a fuse, or an electrically erasable programmable read-only memory; and wherein the light-sensitive integrated circuit and the temperature sensor are both on the semiconductor substrate.

10. The semiconductor chip of claim 9, wherein the light-sensitive integrated circuit comprises one or more photodiodes for receiving different wavelengths of light.

11. The semiconductor chip of claim 9, wherein the light-sensitive integrated circuit has a wavelength dependent sensitivity; and wherein a smallest interval between two measured wavelengths of the wavelength-dependent output signal is smaller than an interval between a relative maximum and a relative minimum on a sensitivity curve defined, in part, by the two measured wavelengths.

12. The semiconductor chip of claim 9, wherein the storage medium is for permanently storing information.

13. A method for use with an integrated circuit that is light sensitive, the method comprising:

illuminating the integrated circuit using an external light source, the integrated circuit comprising a photodiode and producing an output signal in response to light from the external light source;

providing, to the integrated circuit, information about the wavelength of the light from the external light source;

measuring a temperature of the external light source using a temperature sensor;

correcting the information about the wavelength of the light using the temperature to thereby produce corrected information; and correcting the output signal using the corrected information, the output signal being an electrical signal, and the output signal being corrected based on a sensitivity of the photodiode and based on a temperature dependence of the external light source;

wherein the integrated circuit and the temperature sensor are both on a semiconductor substrate, the semiconductor substrate comprising silicon.

14. The method of claim 13, wherein the information comprises a correction value that corresponds to the wavelength of light.

15. The method of claim 14, wherein the correction value comprises a difference between a setpoint value and the output signal at the wavelength.

16. The method of claim 13, wherein the integrated circuit has a sensitivity that is wavelength-dependent; and wherein a smallest interval between two measured wavelengths of the output signal is smaller than an interval between a relative maximum and a relative minimum on a sensitivity curve defined, in part, by the two measured wavelengths.

* * * * *

UNITED STATES PATENT AND TRADEMARK OFFICE
CERTIFICATE OF CORRECTION

PATENT NO. : 7,705,608 B2  Page 1 of 1
APPLICATION NO. : 10/526097
DATED : April 27, 2010
INVENTOR(S) : Thomas Mueller It is certified that error appears in the above-identified patent and that said Letters Patent is hereby corrected as shown below:

Title page, Column 2, Below 5,572,472 A 11/1996 Kearney et al. Insert:

--5,736,848  04/1998  De Vries et al--

Signed and Sealed this

Twentieth Day of July, 2010

David J. Kappos
*Director of the United States Patent and Trademark Office*